United States Patent

Omino

[11] Patent Number: 5,312,506
[45] Date of Patent: * May 17, 1994

[54] METHOD FOR GROWING SINGLE CRYSTALS FROM MELT

[75] Inventor: Akira Omino, Sendai, Japan

[73] Assignee: Mitsui Mining Company, Limited, Tokyo, Japan

[*] Notice: The portion of the term of this patent subsequent to Dec. 1, 2009 has been disclaimed.

[21] Appl. No.: 947,968

[22] Filed: Sep. 21, 1992

Related U.S. Application Data

[63] Continuation of Ser. No. 590,494, Sep. 27, 1990, abandoned, which is a continuation of Ser. No. 309,672, filed as PCT/JP88/00572, Jun. 14, 1900, abandoned.

[30] Foreign Application Priority Data

Jun. 15, 1987 [JP] Japan .................. 62-146939

[51] Int. Cl.$^5$ ............. C30B 7/00; C30B 11/00; C30B 35/00
[52] U.S. Cl. ..................... 117/83; 117/900; 117/954; 117/956; 117/958; 117/955; 117/223
[58] Field of Search ............. 156/616.1, 616.2, 616.3, 156/616.4, 616.41, 620.7, 624, DIG. 72, DIG. 83, DIG. 92; 422/68, 248, 102, 241; 266/286

[56] References Cited

U.S. PATENT DOCUMENTS

| | | | |
|---|---|---|---|
| 1,462,920 | 8/1922 | Sleeper | 422/241 |
| 1,911,608 | 5/1933 | Davis | 422/241 |
| 1,986,196 | 1/1935 | Grosse | 422/241 |
| 2,547,521 | 4/1951 | Buehler | 156/623 Q |
| 3,033,659 | 5/1962 | Fischer | 422/488 |
| 3,203,689 | 8/1965 | Hallowell | 266/286 |
| 3,833,862 | 9/1974 | Wickersheim | 252/301.4 S |
| 3,915,661 | 10/1975 | Vichr | 23/301 R |
| 4,083,748 | 4/1978 | Gault | 156/616.41 |
| 4,207,293 | 6/1980 | Scholl et al. | 156/617.1 |
| 4,324,773 | 4/1982 | Chai et al. | 422/241 |
| 4,335,074 | 6/1982 | Bernas | 422/241 |
| 4,367,866 | 1/1983 | Acker et al. | 266/286 |
| 4,401,625 | 8/1983 | Willay et al. | 422/68 |
| 4,521,272 | 6/1985 | Gault | 156/616.41 |
| 4,529,027 | 7/1985 | Brice et al. | 156/616.1 |
| 4,612,082 | 9/1986 | Westphal et al. | 156/607 |
| 4,956,047 | 9/1990 | Harris et al. | 156/623 Q |
| 5,007,980 | 4/1991 | Swiggard | 156/616.3 |
| 5,064,497 | 11/1991 | Clemans et al. | 156/616.3 |
| 5,135,047 | 8/1992 | Dobran | 156/616.41 |
| 5,167,759 | 12/1992 | Omino | 156/624 |

FOREIGN PATENT DOCUMENTS

| | | | |
|---|---|---|---|
| 1138514 | 10/1962 | Fed. Rep. of Germany. | |
| 58-104100 | 6/1983 | Japan | 156/616.1 |
| 58-148071 | 10/1983 | Japan | 156/616.1 |
| 0923241 | 4/1963 | United Kingdom. | |

OTHER PUBLICATIONS

Patent Abstracts of Japan, vol. 8, No. 15 (C-206)[1452], Jan. 21, 1984; & JP-A-58 181 800 (Matsushita Denki Sangyo K.K.) Oct. 24, 1983 *Abstract*.
Patent Abstracts of Japan, vol. 10, No. 28 (C-326)[2085], Feb. 4, 1986; & JP-A-60 180 988 (Rigaku Denki Kogyo K.K.) Sep. 14, 1985 *Abstract*.
Patent Abstracts of Japan, vol. 11, No. 141 (C-421)[2588], May 8, 1987; & JP-A-61 281 095 (Nippon Mining Co. Ltd.) Dec. 11, 1986 *Abstract*.

Primary Examiner—Gary P. Straub
Attorney, Agent, or Firm—Oblon, Spivak, McClelland, Maier & Neustadt

[57] ABSTRACT

There is here provided a method for growing single crystals from a melt which comprises the steps of preparing a double structure crucible constituted of an inner tube and an outer tube; placing a raw material in the inner tube; hermetically sealing the outer tube; and heating/melting the raw material to perform crystal growth.

According to the present invention, it is possible to hermetically confine and to crystallize the raw material even at a high temperature.

6 Claims, 1 Drawing Sheet

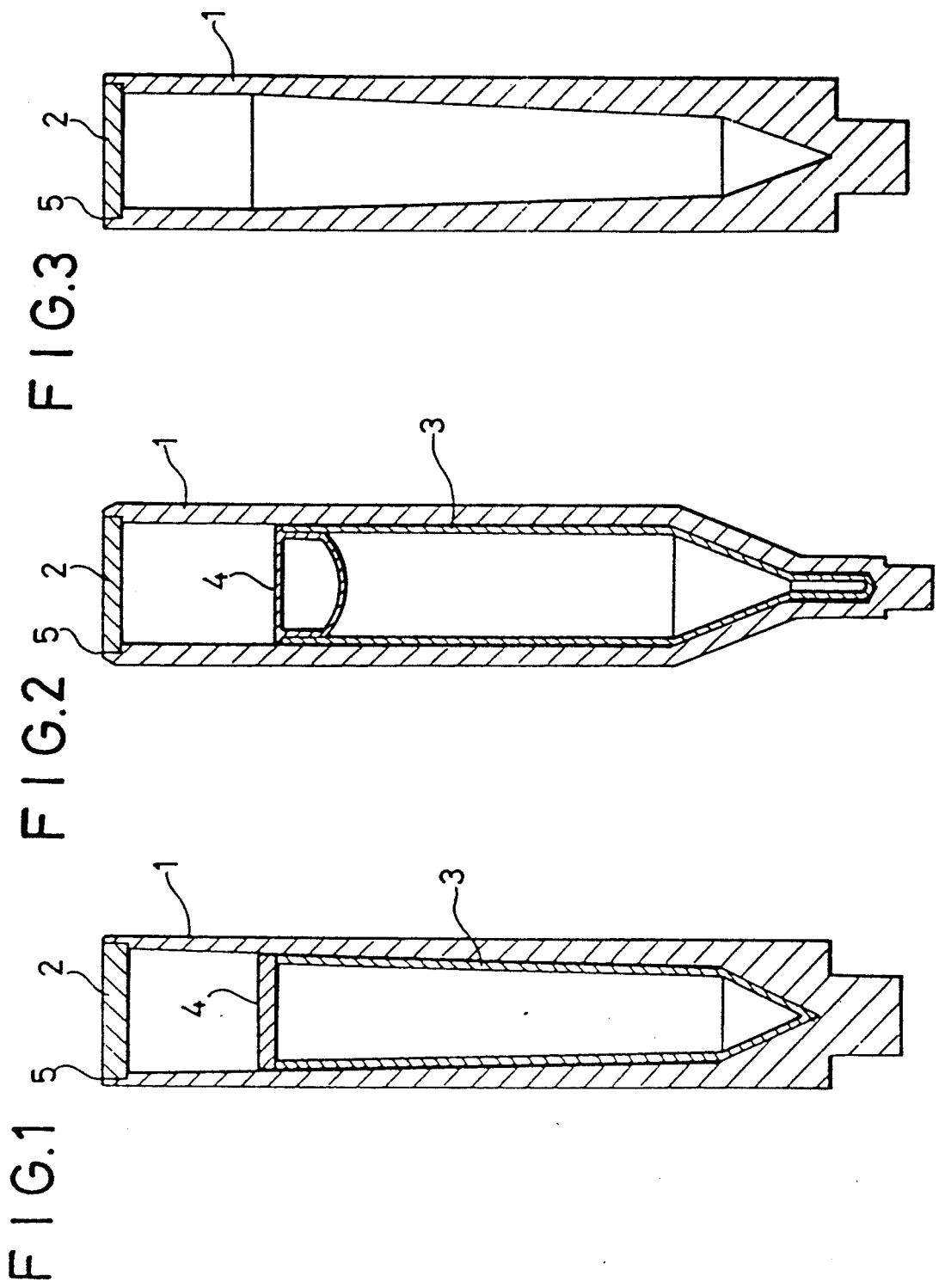

METHOD FOR GROWING SINGLE CRYSTALS FROM MELT

This application is a continuation of application Ser. No. 07/590,494, filed on Sep. 27, 1990, now abandoned. Which is a continuation of Ser. No. 07/309,672, filed as PCT/JP88/00572, Feb. 3, 1989 now abandoned.

DESCRIPTION

1. Technical Field

The present invention relates to a method for obtaining single crystals by solidification, crystal growth out of a melt.

2. Background Art

In recent years, the technique of crystal growth becomes industrially very important with the development of electronic industry and the like. Moreover, much attention is now paid to compound materials such as GaAs, CdS and ZnSe as new functional elements in addition to simple substances such as Si and Ge. For the preparation of single crystals of these materials, there is a method of solidifying them out of a melt. This method is widely utilized to grow the single crystals, since it can provide large crystals relatively easily.

However, when the vapor pressure of the compound melt is high, a good deal of the compound is vaporized from a crucible and thus it is difficult to prepare crystals from the compound. Furthermore, if one component in a compound has a high volatilization rate, the composition of its melt deviates from stoichiometry and normal crystal growth cannot be achieved, with the result that the quality of the prepared crystals is poor.

In general, in order to avoid these problems, a compound is first placed in a quartz ampule and the latter is then sealed, or alternatively the compound is put in a quartz ampule having a high-frequency susceptor therein or in a graphite crucible which can function as the susceptor by itself, and the compound is the heated by means of a high-frequency coil disposed outside the quartz ampule. However, quartz begins to soften at about 1,200° C., and when the temperature further rises, the quartz ampule is deformed and devitrified. In the worst case, the ampule may explode. In consequence, the applicable range of the method using the quartz ampule is limited to compound melts having a temperature of at most 1,400° C.

For the high-melting compound having a melting point of 1,400° C. or more, the so-called high-pressure melting process has been heretofore used which comprises placing the compound in a crucible of graphite or the like, putting the crucible in a high-pressure container, and performing crystal growth, while the vaporization of the compound is inhibited under the pressure of an inactive gas such as argon.

In this process, however, the crucible is not sealed hermetically, and therefore the vaporization of the melt and the deviation of the melt composition from stoichiometry cannot be prevented substantially. In addition, this process has some drawbacks. For example, materials of the high-pressure container and a heater are corroded, and the desired crystals are additionally contaminated with these corroded materials. Furthermore, for the compound having a melting point of 1,400° C. or more, there can be a method for growing crystal which comprises charging a high-melting metal crucible with a raw material, melting/sealing the crucible, and heating it. In this method, however, the produced crystals are difficult to release from the crucible, and corrosion is liable to occur in a contact portion of the melt and the metal, and the crystals tend to be contaminated with the metal. In consequence, the above method has such disadvantages as described above and hence it is not considered to be practical.

DISCLOSURE OF THE INVENTION

An object of the present invention is to provide a method for growing crystals from a hermetically confined raw material even in a temperature range in which quartz ampules cannot be used.

The present invention is directed to a method for growing single crystals from a melt which comprises the steps of preparing a double structure crucible constituted of an outer tube made of a high-melting metal or alloy and an inner tube made of one or more materials selected from the group consisting of a high-melting metal and alloy, a high-melting ceramic material and a carbon material such as graphite; placing a raw material in the inner tube; hermetically sealing the outer tube with an outer lid; heating/melting the raw material to perform crystal growth.

The first feature of the present invention is as follows: The crucible is constituted of the outer and inner tubes in the form of the double structure, the inner tube is made of graphite or ceramic which has properties hard to corrode and easy to release the produced crystals, and the outer tube is made of metal which has a property easy to seal up. This first feature permits the employment of a carbon material such as graphite and a ceramic material such as BN which have excellent characteristics as the material of the crucible. It should be noted that the above-mentioned carbon material and ceramic material have been difficult to weld and have not been thus used as the container for crystallizing the melt in a hermetical state. That is, the first feature of the present invention enables the establishment of the industrially advantageous method for growing the single crystals.

The second feature of the present invention is on the basis of the double structure of the crucible. That is, when the crystals adhere to the crucible, which often occurs, the inner tube is only discarded and the outer tube can be repeatedly used.

The method of the present invention can be applied to the single crystal growth of various raw materials which can provide crystals from their melts, and it can grow the crystals particularly without changing a stoichiomeric ratio of the compound having a high melting point and a high vapor pressure. The method of the present case is preferably applicable to the crystal growth of ZnS, ZnSe, CdS, CdSe, GaP, GaAas, CdTe, HgS, PbS, PbSe, InP and the like.

The method of the present invention can exert the following effects and therefore is very beneficial in an industrial field:

(1) Even the raw material having a high melting point and a high vapor pressure can be crystallized, while it is hermetically confined in the container.
(2) The expensive crucible can be repeatedly used, and the crystal growth can be performed in a relatively inexpensive and usual furnace such as a vacuum furnace or an inactive gas furnace. Therefore, the method of the present invention is economical and advantageous.

BRIEF DESCRIPTION OF DRAWINGS

FIG. 1 is a vertical section illustrating one embodiment of a crucible used in the present invention.

FIG. 2 is a vertical section illustrating another embodiment of the present invention.

FIG. 3 is a vertical section illustrating a conventional tungsten crucible used in a comparative example.

BEST MODE FOR CARRYING OUT THE INVENTION

In a method of the present invention, there is used a double structure crucible constituted of an outer tube with a lid and an inner tube with a lid. A material for the outer tube is selected from the group consisting of metals and alloys which have melting points of 1,500° C. or more and which are excellent in anticorrosion. Typical examples of these materials include metals such as W, Ta, Os, Mo, Ir, Ru, Rh and Pt as well as alloys based on these metals. Above all, W is the most preferable, because it has a high temperature and hence it scarcely contaminate a melt.

One end of the outer tube is closed, and the other free end thereof is adapted so as to be covered with a lid made of the same material as that of the outer tube. The cross-sectional shape of the outer tube is not particularly limited, but it is preferably a concentric circle from the viewpoint of heat transfer.

A material of the inner tube is selected from the group consisting of the above-mentioned metals and alloys for the outer tube; carbon materials such as graphite; ceramic materials such as quartz, carbon-coated quartz, alumina, BN, AlN, BeO, $CaF_2$, MgO, SiC, $SiO_2$, $CeO_2$, $ThO_2ZrO_2$ and $ZrSiO_4$. The inner lid is preferably made of the same material as that of the inner tube.

Above all, graphite and BN are particularly preferable, since they are difficult to wet with a raw material melt and therefore formed crystals can be easily released from the inner tube. The outer shape of the inner tube is adapted so that the inner tube fits in the outer tube when it is inserted therein, and the interior of the inner tube can be optionally shaped in compliance with the desired shape of the crystals. In this case, for the easy release of the crystals from the inner tube, the interior of the inner tube is preferably tapered so as to become thin toward the bottom thereof.

The inner tube may be made of the material having relatively weak strength and may have a thin wall thickness, since the strength required for the inner tube is not so severe as in the case of the outer tube.

Now, reference to a method for growing the crystals according to the present invention will be made in detail with regard to an embodiment using a crucible shown in FIG. 1. As the materials of the outer and inner tubes, those which do not react with a raw material melt should be suitably selected from the above-mentioned examples. As described above, it is most general to use W as the material for the outer tube and graphite or BN as the material for the inner tube.

It is preferred that the respective parts are beforehand cleaned by burning and the like prior to charging them with a raw material.

In the first place, an inner tube 3 is charged with a raw material for crystals. The raw material may be intactly used in a powder state, but preferably it is used after its density is increased by pressing or sintering. The inner tube which has been charged with the raw material is inserted into an outer tube 1, and the inner tube 3 is closed with an inner lid 4 made of the same material as that of the inner tube 3. Afterward, the outer tube 1 is closed with an outer lid 2 made of the same material as that of the outer tube 1, and welding is carried out at a weld portion 5 so as to hermetically seal the outer tube 1 with the outer lid 2 in vacuo or an inert gas atmosphere under atmospheric pressure or an applied pressure. When the sealing is made in vacuo, the procedure is as follows: The crucible is put in a vacuum device, and the outer lid is then welded to the outer tube by means of electron beams, laser beams or the like, while all of the crucible except the upper portion thereof is cooled by the use of, for example, a water cooling block in order to cool the whole crucible except the weld portion 5 and to thereby perfectly inhibit the raw material from evaporating at the time of the welding. The electron beam welding is usually carried out in vacuo, but in the case of using the laser beams, the welding can be also possible in the inert gas atmosphere. Therefore, when the crystal growth in the inactive gas atmosphere is desired, the crucible can be filled with an inert gas.

The raw material received in the metallic outer tube is crystallized in an inert gas furnace or a vacuum furnace in accordance with a conventional manner such as the Bridgman's method.

After the step of the crystal growth, the crucible is cooled, and the upper portion thereof is cut off and the formed crystals are then taken out therefrom. If the outer tube is constituted so as to have the sufficiently long upper portion, the outer tube can be repeatedly used. When the outer tube is shortened by the repeated use it is also possible add a suitable piece to the outer tube by welding. When the inner tube is made of graphite or BN, and in addition, when the inner tube is tapered so as to become thin toward the bottom thereof, the crystal is easily released therefrom in almost cases. Thus, the inner tube can be reused intactly. If the crystals are not released from the inner tube, the latter is broken to take out the crystal therefrom. In this case, the inner tube is disposed of, which is nevertheless fairly economical, as compared with the breakage of the whole crucible. In such case for the easy removal of the crystals, it is recommendable to beforehand notch the outer surface of the inner tube.

Furthermore, as shown in FIG. 2, the tip portion of the inner tube 3 may be formed into the shape of a thin pipe in order to enable accurate temperature control at this portion where initial crystallization occurs and in order to thereby smooth the crystal growth. In this case, the release of the crystals from the inner tube is difficult, and the crystals are liable to break in the thin pipe portion thereof, so that a part of the crystals often remains therein. However, when the next crystallization is carried out in the inner tube in which the crystals still remain partially in the thin pipe portion, the growth direction is stabilized, whereby the high-quality crystals can be obtained.

EXAMPLE 1

By the use of a crucible having the structure shown in FIG. 1 and comprising an outer tube made of tungsten and an inner tube made of thermally decomposed graphite, single crystals of ZnSe (melting point = 1,520° C.) were grown. This crystal growth was carried out by the following procedure: In the first place, the respective parts of the crucible were beforehand cleaned by burning them at about 1,700° C. in vacuo prior to using any raw material. About 15 g of ZnSe (made by E. Merck AG) raw material powder was pressed/molded at 15 kg/cm³ by a rubber press, and an inner tube was charged with the thus molded raw material and was then sealed with an inner lid. Afterward, the inner tube which was charged with the raw material was inserted into an outer tube and the latter was then sealed with an outer lid. The thus prepared crucible was then put in an electron beam welding device, and welding was carried out under a pressure of about $10^{-5}$ Torr to seal the outer tube hermetically. In this case, the crucible was all cooled except the weld portion by a water cooling block made of copper so that the raw material therein might not vaporize. The crucible was then put in a vacuum furnace type Bridgman crystal growth device, and a maximum temperature was set to 1,580° C. Crystal growth was then performed at a crucible descending speed of 2 mm/hr. After cooling, the upper portion of the crucible was cut off by a diamond cutter, and the inner tube was taken out therefrom. Formed crystals could be easily released from the inner tube made of thermally decomposed graphite. The crystals were transparent but assumed yellow, and any trace of the reaction of graphite with ZnSe was not observed. By analysis of ICP sepctroscopy, any tungsten was not detected in the crystals.

EXAMPLE 2

To perform the crystal growth of GaAs (melting point=1,237° C.), the same procedure as in Example 1 was repeated with the exception that an outer tube made of tungsten and an inner tube made of pyrolytic BN were used, that a maximum temperature was set to 1,290° C., and that GaAs powder was used as a raw material. The formed crystals could be easily released from the pyrolytic BN inner tube. The crystals had blueish metallic color, and the reaction of BN with GaAs was not observed. By the analysis of ICP spectroscopy, any tungsten was not detected in the crystals.

EXAMPLE 3

The single crystal growth of ZnSe was performed, using a crucible having the structure shown in FIG. 2 and comprising an outer tube made of molybdenum and an inner tube made of pyrolytic BN. This crystal growth was carried out by the following procedure: In the first place, the respective parts of the crucible were beforehand cleaned by burning them at about 1,700° C. in vacuo prior to using the raw material. The inner tube was charged with about 15 g of ZnSe (Rare Metallic Inc.) crystalline chips (size=1 mm×1 mm), and the other steps were carried out in the same manner as in Example 1 in order to achieve the crystal growth. The formed crystals could be easily released from the inner tube made of pyrolytic BN, but in the thin pipe bottom portion of the inner tube, there remained a part of the crystals.

In succession, about 15 g of fine crystals which were a raw material were fed into the inner tube in which the crystals still remained in the thin pipe bottom portion. The upper portion of the molybdenum outer tube used in the above first crystal growth was reformed, and the empty outer tube was then burned at 1,700° C. After the inner tube was inserted into the outer tube, the crystal growth was performed in the same manner as in the above first step, and good crystals were then obtained in which a growth direction was the same as in the first step and in which the single crystals were present in a great region.

Comparative Example

The same procedure as in Example 1 was repeated with the exception that a crucible having the structure shown in FIG. 3 and made of tungsten was used, in order to achieve the single crystal growth of ZnSe. The resulting crystals could not be released from the crucible. For the release of the product therefrom, the crucible was required to be cut into several pieces by a diamond cutter. Furthermore, at this time, water used to wet the blade of the diamond cutter and cuttings of the tungsten adhered to the crystals.

I claim:

1. A method for growing single crystals of a compound substance having a high melting point and which has a substantial vapor pressure from a melt, which comprises the steps of:
   (a) charging the starting material into an inner crucible which is adapted to hold the starting material and the melt and which is formed from at least one material selected from the group consisting of high-melting ceramic materials and carbon which is durable to heat in the heating step of the process;
   (b) closing the inner crucible with a lid made of the same material as that of the inner crucible;
   (c) inserting the inner crucible with the starting material charged therein into an outer crucible made of a weldable and high-melting material selected from the group consisting of metals and alloys having melting points of 1500° C. or more, the interior shape of the outer crucible being so shaped that the inner crucible may be inserted into the outer crucible;
   (d) hermetically sealing the outer crucible with an outer lid by welding said outer lid to said outer crucible;
   (e) placing the thus-assembled double-structure crucible in a vessel which is equipped with a heating means, and
   (f) heating the double-structure crucible to melt the raw material and allowing the melt to cool over a temperature gradient to effect crystal growth.

2. A method for growing single crystals of a compound substance having a high melting point and which has a substantial vapor pressure from a melt, which comprises the steps of:
   (a) charging the starting material into an inner crucible which is adapted to hold the starting material and the melt and which is formed from at least one material selected from the group consisting of high-melting ceramic materials and carbon which is durable to heat in the heating step of the process;
   (b) closing the inner crucible with a lid made of the same material of the inner crucible;
   (c) inserting the inner crucible with the starting material charged therein into an outer crucible made of a weldable and high-melting material selected from the group consisting of metals and alloys having melting points of 1500° C. or more;
   (d) hermetically sealing the outer crucible with an outer lid by welding said outer lid to said outer crucible;
   (e) placing the thus-assembled double-structure crucible in a vessel which is equipped with a heating means; and (f) heating the double-structure crucible to melt the raw material and allowing the melt to cool over a temperature gradient whereby the melt is cooled and solidified from one end of the crucible to the other to effect crystal growth.

3. The method of claim 2, wherein said carbon material is graphite.

4. The method of claim 2, wherein said ceramic is quartz, carbon-coated quartz, alumina, BN, AlN, BeO, $CaF_2$, MgO, SiC, $SiO_2$, $CeO_2$, $ThO_2$, $ZrO_2$ or $ZrSiO_4$.

5. The method according to claim 2, wherein the material of said outer tube is a metal selected from the group consisting of W, Ta, Os, Mo, Ir, Ru, Rh and Pt, or alloys prepared from these metals.

6. The method according to claim 2, wherein the crystals grown are those of ZnS, ZnSe, CdS, CdSe, GaP, GaAs, CdTe, HgS, PbS, PbSe or InP.

* * * * *

UNITED STATES PATENT AND TRADEMARK OFFICE
CERTIFICATE OF CORRECTION

PATENT NO. : 5,312,506
DATED : May 17, 1994
INVENTOR(S) : Akira OMINO

It is certified that error appears in the above-indentified patent and that said Letters Patent is hereby corrected as shown below:

On the title page, Item [63] and Column 1, Line 8, the PCT date should read as follows:

--Jun. 14, 1988--

Signed and Sealed this

Sixteenth Day of August, 1994

*Attest:*

BRUCE LEHMAN

*Attesting Officer*     *Commissioner of Patents and Trademarks*